United States Patent
Yano (10) Patent No.: US 9,242,198 B2
(45) Date of Patent: Jan. 26, 2016

(54) VENTILATION MEMBER

(71) Applicant: Nitto Denko Corporation, Ibaraki-shi, Osaka (JP)

(72) Inventor: Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 128 days.

(21) Appl. No.: 14/261,098

(22) Filed: Apr. 24, 2014

(65) Prior Publication Data

US 2015/0306529 A1    Oct. 29, 2015

(51) Int. Cl.
*B01D 53/22* (2006.01)
*B01D 46/00* (2006.01)
*H05K 5/06* (2006.01)
*H05K 7/20* (2006.01)

(52) U.S. Cl.
CPC ............ *B01D 46/0002* (2013.01); *B01D 53/22* (2013.01); *H05K 5/068* (2013.01); *H05K 7/20181* (2013.01); *B01D 2053/221* (2013.01); *B01D 2279/35* (2013.01)

(58) Field of Classification Search
CPC ........ B01D 46/10; B01D 53/22; B10D 45/16; B60R 16/0239; F21S 48/335; F21V 31/03; H02K 5/10; H02K 2205/09; H05K 5/0213
USPC .................. 55/385.4, 462, DIG. 19; 96/4; 123/41.86; 454/367
See application file for complete search history.

(56) References Cited

U.S. PATENT DOCUMENTS

| | | | | |
|---|---|---|---|---|
| 5,891,223 A | * | 4/1999 | Shaw ..................... | B01D 46/10 55/385.4 |
| 6,994,621 B2 | | 2/2006 | Mashiko et al. | |
| 8,246,726 B2 | * | 8/2012 | Yano ..................... | B60R 16/0239 123/41.86 |
| 8,814,993 B2 | * | 8/2014 | Yano ..................... | H05K 5/0213 55/385.4 |
| 2005/0091950 A1 | * | 5/2005 | Weaver .................... | B60T 11/26 55/385.4 |
| 2005/0279061 A1 | * | 12/2005 | Broughton ............. | B01D 45/16 55/385.4 |
| 2006/0096258 A1 | * | 5/2006 | Gouzou ............... | B60K 15/035 55/385.4 |
| 2008/0141635 A1 | * | 6/2008 | Clerget ............... | B05B 11/0021 55/385.4 |
| 2009/0084078 A1 | * | 4/2009 | Furuyama ............. | F21S 48/335 55/385.4 |

FOREIGN PATENT DOCUMENTS

JP    2004-047425    2/2004

* cited by examiner

*Primary Examiner* — Duane Smith
*Assistant Examiner* — Minh-Chau Pham
(74) *Attorney, Agent, or Firm* — Hamre, Schumann, Mueller & Larson, P.C.

(57) ABSTRACT

A ventilation member of the present invention includes: a support having a through hole serving as an air passage between an interior space and an exterior space of a housing when the support is attached to the opening of the housing; a filter member disposed on the support to cover an aperture of the through hole that opens into the interior space; and an air-permeable membrane disposed on the support to cover an aperture of the through hole that opens into the exterior space. The through hole includes: a first air passage extending in a predetermined direction from one end of the first air passage to the other end of the first air passage, the one end forming the aperture that opens into the interior space; a second air passage having one end connected to a side of the first air passage and the other end forming the aperture that opens into the exterior space; and a dead end passage extending in the predetermined direction from the other end of the first air passage.

5 Claims, 6 Drawing Sheets

VENTILATION MEMBER

BACKGROUND OF THE INVENTION

1. Field of the Invention

The present invention relates to ventilation members.

2. Description of Related Art

Figure 9:
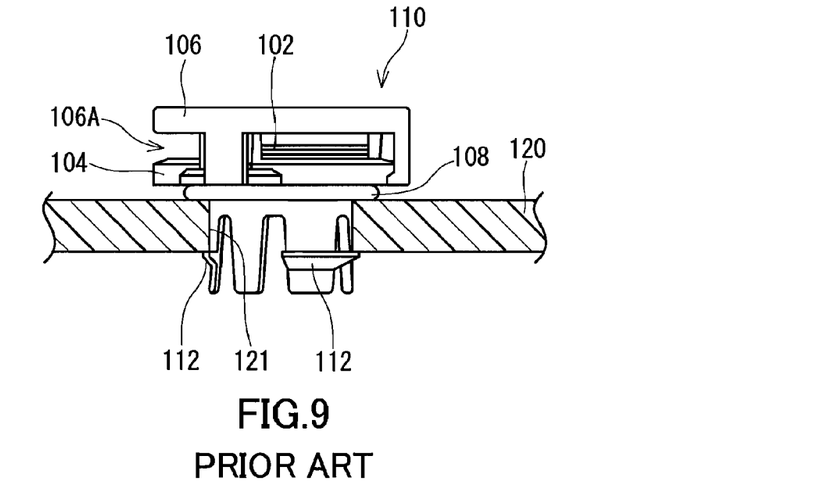
FIG. 9 is a cross-sectional view of a conventional ventilation member.

Conventionally, in automotive electrical/electronic components such as automotive lamps and ECUs (electronic control units), OA (office automation) equipment, household electrical appliances, medical equipment, etc., openings are formed in housings containing electronic components, control boards, etc. to reduce pressure fluctuations due to temperature changes in the housings or to ventilate the interior of the housings, and ventilation members are attached to the openings. These ventilation members not only ensure ventilation between the interior and exterior of the housings but also prevent foreign substances such as dust and water from entering the housings. JP 2004-047425 A discloses an example of such a ventilation member. FIG. 9 shows a ventilation member disclosed in JP 2004-047425 A.

A ventilation member 110 includes a support 104, an air-permeable membrane 102 disposed on the support 104, a cover member 106 covering the air-permeable membrane 102, and a sealing member 108 to be mounted in a gap between the support 104 and a housing 120. The ventilation member 110 is fixed to an opening 121 of the housing 120 via the sealing member 108. Leg portions 112 of the support 104 are engaged with the opening 121 to prevent detachment of the ventilation member 110 from the housing 120. A plurality of apertures 106A are formed in the side wall of the cover member 106. Air flows into and out of the housing 120 through the air-permeable membrane 102 and the apertures 106A of the cover member 106. Thus, ventilation between the interior and exterior of the housing 120 can be ensured.

SUMMARY OF THE INVENTION

In an automotive electrical/electronic component, a ventilation member serves as a pressure regulator for a housing. Specifically, when the pressure inside the housing is higher than that outside the housing, that is, when the pressure inside the housing is a positive pressure, a gas inside the housing flows from the interior space of the housing to the exterior space thereof through the ventilation member. On the other hand, when the pressure inside the housing is lower than that outside the housing, that is, when the pressure inside the housing is a negative pressure, a gas outside the housing flows from the exterior space of the housing to the interior space thereof through the ventilation member. The gas inside the housing sometimes contains oil mist. Therefore, when the pressure inside the housing is a positive pressure and the gas flows from the interior space of the housing to the exterior space thereof, the oil mist may adhere to the air-permeable membrane and deteriorate the function of the air-permeable membrane as a pressure regulator.

In view of these circumstances, it is an object of the present invention to provide a ventilation member suitable for preventing adhesion of airborne oil mist in a housing to an air-permeable membrane.

The present invention provides a ventilation member attachable to an opening of a housing. This ventilation member includes: a support having a through hole serving as an air passage between an interior space and an exterior space of the housing when the support is attached to the opening; a filter member disposed on the support to cover an aperture of the through hole that opens into the interior space; and an air-permeable membrane disposed on the support to cover an aperture of the through hole that opens into the exterior space. The through hole includes: a first air passage extending in a predetermined direction from one end of the first air passage to the other end of the first air passage, the one end forming the aperture that opens into the interior space; a second air passage having one end connected to a side of the first air passage and the other end forming the aperture that opens into the exterior space; and a dead end passage extending in the predetermined direction from the other end of the first air passage.

In the ventilation member of the present invention, the dead end passage extends from the other end of the first air passage. When the pressure inside the housing is a positive pressure and a gas flows from the interior space of the housing to the exterior space thereof, the oil mist that enters the first air passage and the dead end passage through the filter member coalesces into larger oil droplets, and adheres to the inner wall of the first air passage and the dead end passage. As a result, the oil mist is less likely to enter the second air passage, and adhesion of the airborne oil mist in the housing to the air-permeable membrane can be prevented.

DETAILED DESCRIPTION OF THE INVENTION

Hereinafter, embodiments of the present invention are described with reference to the accompanying drawings. The following description relates to exemplary embodiments of the present invention, and the present invention is not limited to these embodiments.

First Embodiment

Figure 1:
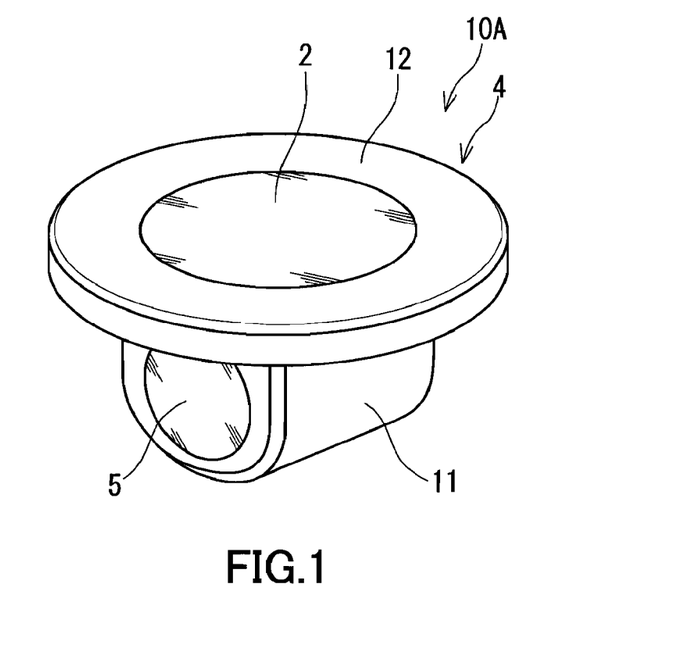
FIG. 1 is a perspective view of a ventilation member according to a first embodiment of the present invention.
Figure 2:
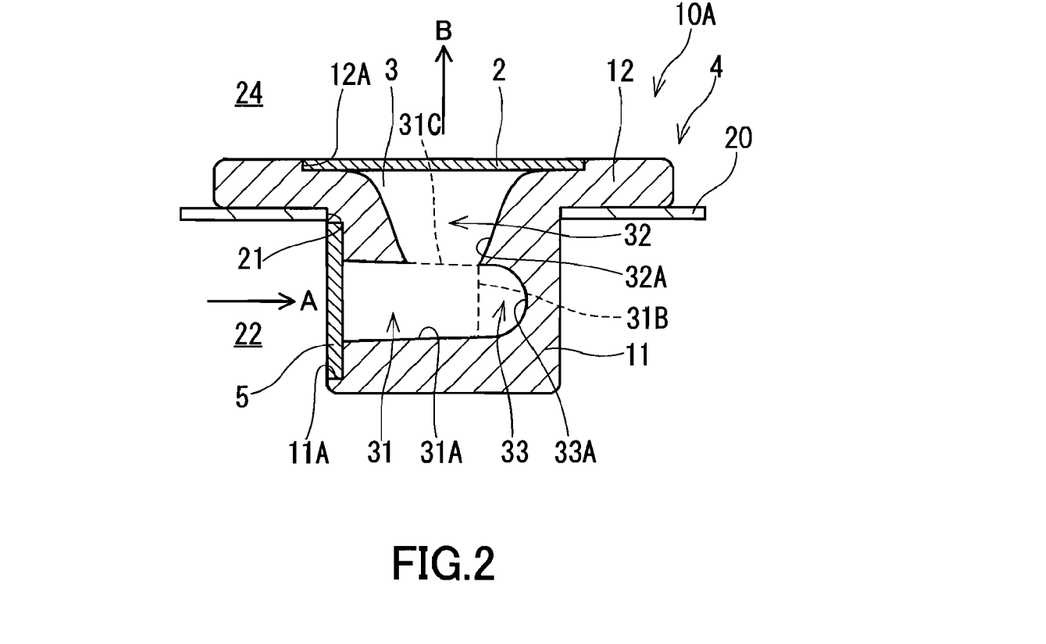
FIG. 2 is a cross-sectional view of the ventilation member shown in FIG. 1.

As shown in FIG. 2, a ventilation member 10A according to a first embodiment of the present invention is adapted to be attached to an opening 21 of a housing 20. As shown in FIG. 2, the opening 21 is a through hole communicating an interior space 22 and an exterior space 24 of the housing 20. As shown in FIG. 1 and FIG. 2, the ventilation member 10A includes an air-permeable membrane 2, a support 4, and a filter member 5. The air-permeable membrane 2 has a circular shape in plan view. The support 4 has a vent hole 3 that is a through hole serving as an air passage between the interior space 22 and the exterior space 24. The air-permeable membrane 2 is disposed on the support 4 so as to cover one end of the vent hole 3 that opens into the exterior space 24. The filter member 5 is disposed on the support 4 so as to cover the other end of the vent hole 3 that opens into the interior space 22. The filter member 5 has a circular shape in side view. Air can flow between the interior space 22 and the exterior space 24 through the filter member 5 and the air-permeable membrane 2. The housing 20 is, for example, an automotive ECU (Electronic Control Unit) box, and FIG. 2 shows only a part of the housing 20.

As shown in FIG. 1 and FIG. 2, the support 4 has a first supporting portion 11 that supports the filter member 5 and a second supporting portion 12 that supports the air-permeable membrane 2. The first supporting portion 11 has a rectangular shape as viewed from a side perpendicular to the side on which the filter member 5 is supported. The second supporting member 12 has a circular shape in plan view. As shown in FIG. 2, the first supporting portion 11 has formed in its side wall an aperture 11A of the vent hole 3 communicating with the interior space 22. The filter member 5 is disposed on the first supporting portion 11 to cover the aperture 11A of the vent hole 3 that opens into the interior space 22 (in the left part of FIG. 2). The aperture 11A that opens into the interior space 22 is formed in a recess of the first supporting portion 11 such that the filter member 5 is entirely fitted in the recess. The second supporting portion 12 has in its top wall an aperture 12A of the vent hole 3 communicating with the exterior space 22. The air-permeable membrane 2 is disposed on the second supporting portion 12 to cover the aperture 12A of the vent hole 3 that opens into the exterior space 24 (in the upper part of FIG. 2). The aperture 12A that opens into the exterior space 24 is formed in a recess of the second supporting portion 12 such that the air-permeable membrane 2 is entirely fitted in the recess.

As shown in FIG. 2, the vent hole 3 has a first air passage 31, a second air passage 32, and a dead end passage (dead end portion) 33. The first air passage 31 extends in a first direction A (rightward direction in FIG. 2) from one end of the first air passage 31 to the other end 31B of the first air passage 31, and the one end forms the aperture 11A that opens into the interior space 22. The second air passage 32 has one end connected to a side 31C of the first air passage 31 and the other end forming the aperture 12A that opens into the exterior space 24. The second air passage 32 extends in a second direction B (upward direction in FIG. 2) perpendicular to the first direction A. The dead end passage 33 extends in the first direction A from the other end 31B of the first air passage 31. The first air passage 31 is a hole extending straight in the first direction A from the aperture 11A that opens into the inner space 22 toward the dead end passage 33. The aperture 11A that opens into the interior space 22 opens in a direction intersecting a direction in which the support 4 is attached to the opening 21 (downward direction in FIG. 2). Specifically, the aperture 11a opens in a direction perpendicular to the direction in which the support 4 is attached to the opening 21. The first air passage 31 extends in the direction intersecting the direction in which the support 4 is attached to the opening 21. Specifically, the first air passage 31 extends in the direction perpendicular to the direction in which the support 4 is attached to the opening 21. The second air passage 32 is a hole communicating with the first air passage 31 and extending in the second direction B with its diameter increasing from the side 31C of the first air passage 31 toward the aperture 12A that opens into the exterior space 24. The dead end passage 33 is a hole communicating with the first air passage 31 and extending straight in the first direction A from the other end 31B of the first air passage 31. The first direction A is a direction in which the filter member 5 is attached to the aperture 11A that opens into the exterior space 22. The second direction B is a direction perpendicular to the first direction A, that is, a direction in which the air-permeable membrane 2 is detached from the aperture 12A that opens into the exterior space 24.

Next, the air-permeable membrane 2 is described. The structure and material of the air-permeable membrane 2 are not particularly limited and any membrane can be used as long as it has the properties of allowing gases to pass therethrough and preventing liquids from passing therethrough. The air-permeable membrane 2 may have a membrane body and a reinforcing material laminated on the membrane body. The strength of the air-permeable membrane 2 is increased by the reinforcing material added thereto. It should be understood that the air-permeable membrane 2 may consist of the membrane body.

The membrane body may be subjected to an oil-repellent treatment or a water-repellent treatment. This liquid-repellent treatment can be performed by applying a substance having a low surface tension to the membrane body, followed by drying and then curing. Any liquid-repellent agent can be used for the liquid-repellent treatment as long as a coating film having a lower surface tension than that of the membrane body can be formed using the agent. For example, a liquid-repellent agent containing a polymer having a perfluoroalkyl group can be suitably used. The liquid-repellent agent is applied to the membrane body by a known technique such as impregnation or spraying.

A typical example of the membrane body is a porous membrane made of a fluorine resin or a polyolefin. In terms of ensuring sufficient waterproofness, a porous resin membrane having an average pore diameter of 0.01 to 10 μm can be used as the membrane body.

Examples of the fluorine resin suitable for use as the membrane body 2a include polytetrafluoroethylene (PTFE), polychlorotrifluoroethylene, tetrafluoroethylene-hexafluoropropylene copolymer, and tetrafluoroethylene-ethylene copolymer. Examples of the polyolefin suitable for use as the membrane body include polymers and copolymers of monomers such as ethylene, propylene, and 4-methylpentene-1,1 butene. Porous nanofiber film materials containing polyacrylonitrile, nylon, or polylactic acid may also be used. In particular, PTFE is preferred because it has not only high air permeability per unit area but also high ability to prevent foreign substances from entering the housing. Porous PTFE membranes can be produced by known molding techniques such as stretching and extraction.

The reinforcing material can be a member made of a resin such as polyester, polyethylene, or aramid. The form of the reinforcing material is not particularly limited as long as the air permeability of the air-permeable membrane 2 can be maintained. For example, the reinforcing member is a woven fabric, a nonwoven fabric, a net, a mesh, a sponge, a foam, or a porous material. The membrane body and the reinforcing member may be laminated together by heat lamination, heat welding, or ultrasonic welding, or with an adhesive.

The thickness of the air-permeable membrane 2 is preferably in the range of 1 μm to 5 mm, in view of the strength and the ease of handling. The air permeability of the air-permeable membrane 2 is preferably in the range of 0.1 to 300 sec/100 $cm^3$ in terms of Gurley Number obtained by the Gurley test method specified in JIS (Japanese Industrial Standards) P 8117. The water entry pressure of the air-permeable membrane 2 is preferably 1.0 kPa or more.

Methods for fixing the air-permeable membrane 2 to the support 4 are as follows. When the support 4 is made of a thermoplastic resin, heat welding such as ironing welding, ultrasonic welding, or laser welding is preferably used. However, in the present embodiment, another material such as a double-sided adhesive tape or an adhesive may be used in combination because the oil droplets OL do not flow into a region of the support 4 where the air-permeable membrane 2 is disposed.

Figure 11:
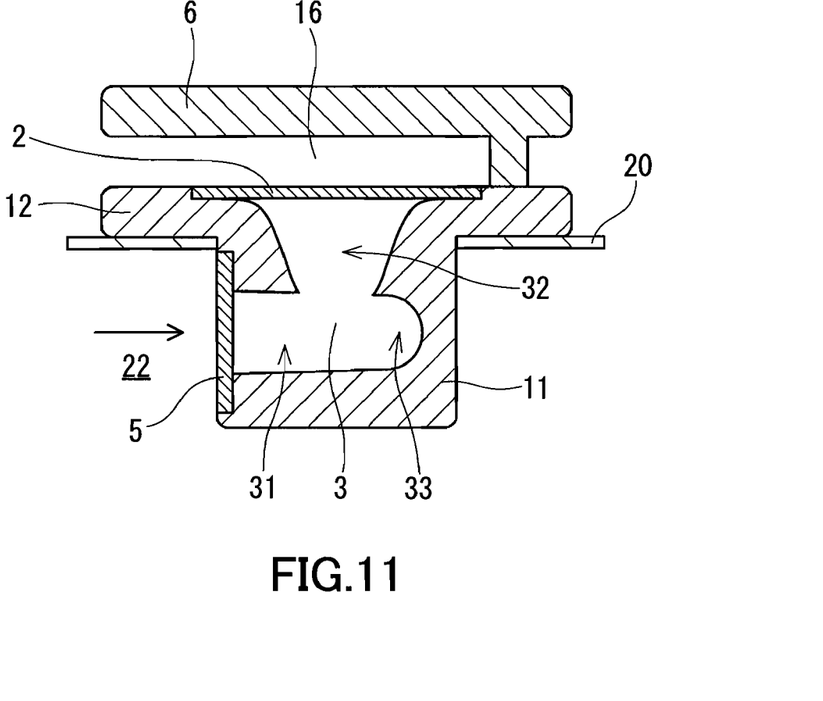
FIG. 11 is a cross-sectional view of a ventilation member having a cover member.

In order to protect the air-permeable membrane 2, the ventilation member 10A may further include a cover member 6 (see FIG. 11) provided over the air-permeable membrane 2 to cover the support 4 and having an aperture for communicating with the exterior space 24 of the housing 20. A ventilation space 16 serving as a part of the air passage between the interior space 22 and the exterior space 24 is formed between the support 4 and the cover member 6. The cover member 6 may have the same shape as the cover member 106 shown in FIG. 9.

Next, the filter member 5 is described. The filter member 5 is a filter that allows gases to pass therethrough and prevents the oil droplets OL from passing therethrough. The structure and material of the filter member 5 are not particularly limited as long as it is a woven fabric, a nonwoven fabric, a mesh, or a net made of a resin or a metal. In the present embodiment, SP7600HF (manufactured by Sony Chemical & Information Device Corporation) is used as the filter member 5.

Next, a method for producing the support 4 is described. The support 4 can be produced by a known injection molding technique. In view of moldability and weldability, it is preferable to use a thermoplastic resin as a material for the support 4. Examples of the thermoplastic resin include PA (polyamide), PET (polyethylene terephthalate), PPS (polyphenylene sulfide), PBT (polybutylene terephthalate), PC (polycarbonate), PP (polypropylene), PPE (polyphenylene ether), and elastomers. A metal or a thermosetting resin also can be used for the support 4. Examples of the thermosetting resin include NBR (nitrile butadiene rubber), EPDM (ethylene propylene diene monomer rubber), silicone rubber, fluorine rubber, acrylic rubber and hydrogenated nitrile rubber.

Figure 3:
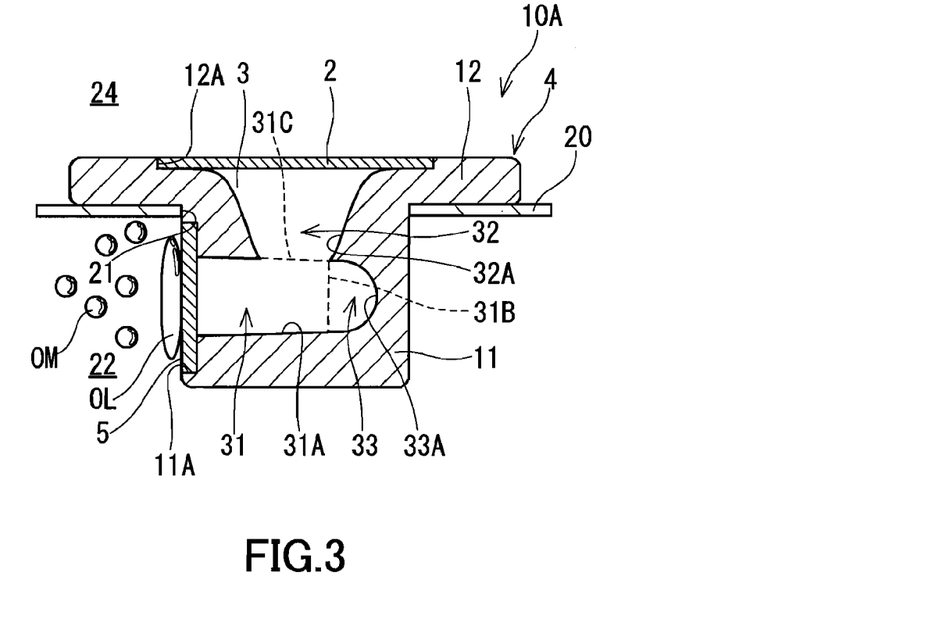
FIG. 3 is a cross-sectional view of the ventilation member shown in FIG. 1 in a normal state.
Figure 4:
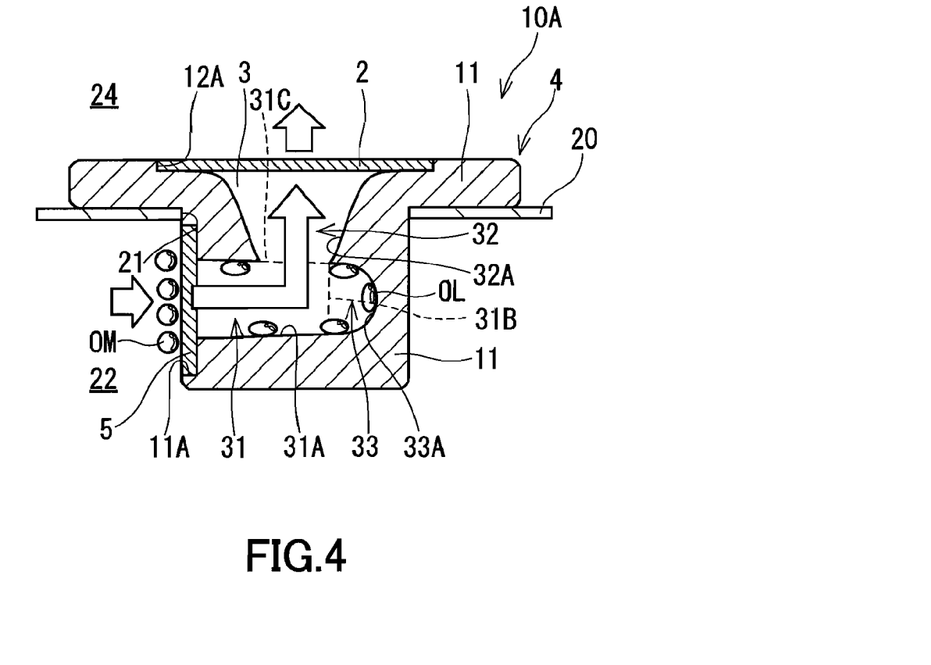
FIG. 4 is a cross-sectional view of the ventilation member shown in FIG. 1 in a positive pressure state.

In the present embodiment, when the pressure inside the housing 20 is equal to the pressure outside the housing 20, oil droplets OL adhere to the surface of the filter member 5 exposed to the interior space 22 but do not pass through the filter member 5, as shown in FIG. 3. That is, the oil droplets OL do not move from the interior space 22 of the housing 20 to the first air passage 31. On the other hand, when the pressure inside the housing 20 is a positive pressure, oil mist OM in the interior space 22 of the housing 20 passes through the filter member 5, as shown in FIG. 4. That is, the oil mist OM moves from the interior space 22 of the housing 20 to the first air passage 31. When the oil mist OM enters the first air passage 31 and the dead end passage 33 through the filter member 5, the oil mist OM coalesces into larger oil droplets OL therein. Then, the oil droplets OL adhere to the inner wall 31A of the first air passage 31 and the inner wall 33A of the dead end passage 33. As shown in FIG. 4, since the oil mist OM that has passed through the filter member 5 goes straight ahead even if the airflow direction is changed, the oil mist OM does not enter the second air passage 32 and thus the oil droplets OL do not adhere to the inner wall 32A of the second air passage 32. Since the oil mist OM does not enter the second air passage 32, adhesion of the oil mist OM to the air-permeable membrane 2 can be prevented.

In the present embodiment, when the pressure inside the housing 20 is a negative pressure, the oil mist OM in the first air passage 31 passes through the filter member 5. That is, the oil mist OM moves from the first air passage 31 to the interior space 22 of the housing 20. In the case where the filter member 5 is a type of filter member that allows the oil droplets OL to penetrate under their own weight, the oil droplets OL in the filter member 5 return to the interior space 22 of the housing 20 under their own weight without remaining in the filter member 5.

Second Embodiment

FIG. 5 to FIG. 8 show a ventilation member 10B according to a second embodiment. The ventilation member 10B according to the second embodiment is the same as the first embodiment described above except for the shape of the support 4. Therefore, the description of the same parts is omitted.

Figure 5:
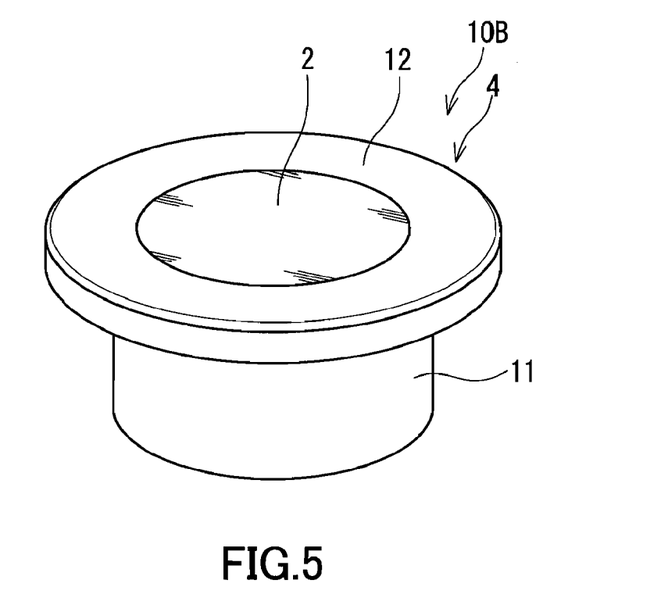
FIG. 5 is a perspective view of a ventilation member according to a second embodiment of the present invention.
Figure 6:
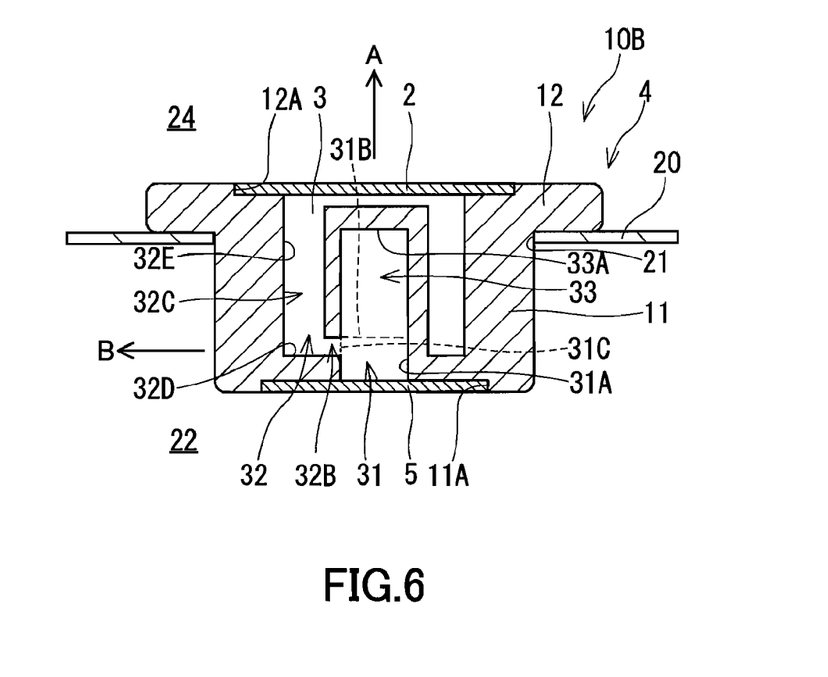
FIG. 6 is a cross-sectional view of the ventilation member shown in FIG. 5.

As shown in FIG. 5 and FIG. 6, the support 4 has the first supporting portion 11 that supports the filter member 5 and the second supporting portion 12 that supports the air-permeable membrane 2. The first supporting member 11 and the second supporting member 12 have a circular shape in plan view. As shown in FIG. 6, the first supporting portion 11 has formed in its bottom wall the aperture 11A of the vent hole 3 communicating with the interior space 22. The filter member 5 is disposed on the first supporting portion 11 to cover the aperture 11A of the vent hole 3 that opens into the interior space 22 (in the lower part of FIG. 6). The aperture 11A that opens into the interior space 22 is formed in a recess of the first supporting portion 11 such that the filter member 5 is entirely fitted in the recess. The second supporting portion 12 has formed in its top wall the aperture 12A of the vent hole 3 communicating with the exterior space 24. The air-permeable membrane 2 is disposed on the second supporting portion 12 to cover the aperture 12A of the vent hole 3 that opens into the exterior space 24 (in the upper part of FIG. 2). The aperture 12A that opens into the exterior space 24 is formed in a recess of the second supporting portion 12 such that the air-permeable membrane 2 is entirely fitted in the recess.

As shown in FIG. 6, the vent hole 3 has the first air passage 31, the second air passage 32, and the dead end passage (dead end portion) 33. The first air passage 31 extends in the first direction A (upward direction in FIG. 6) from one end of the first air passage 31 to the other end 31B of the first air passage 31, and the one end forms the aperture 11A that opens into the interior space 22. The second air passage 32 has one end connected to the side 31C of the first air passage 31 and the other end forming the aperture 12A that opens into the exterior space 24. Specifically, the second air passage 32 firstly extends in the second direction B (leftward direction in FIG. 6) perpendicular to the first direction A from the side 31C of the first air passage 31 and secondly extends in the first direction A from the end of the first part. The dead end passage 33 extends in the first direction A from the other end 31B of the first air passage 31. The first air passage 31 is a hole extending straight in the first direction A from the aperture 11A that opens into the inner space 22 toward the dead end passage 33. The aperture 11A that opens into the interior space 22 opens in a direction in which the support 4 is attached to the opening 21, and the first air passage 31 extends in the opposite direction to the direction in which the support 4 is attached to the opening 21. The second air passage 32 has: a first sub-passage 32B having one end connected to the side 31C of the first air passage 31; and a second sub-passage 32C having one end connected to the first sub-passage 32B and the other end connected to the aperture 12A that opens into the exterior space 24. The first sub-passage 32B extends in a direction intersecting the direction in which the support 4 is attached to the opening 21. Specifically, the first sub-passage 32B extends in the second direction B perpendicular to the direction in which the support 4 is attached to the opening 21. The second sub-passage 32C extends in the same direction as the direction in which the support 4 is attached to the opening 21, that is, in the first direction A.

Figure 7:
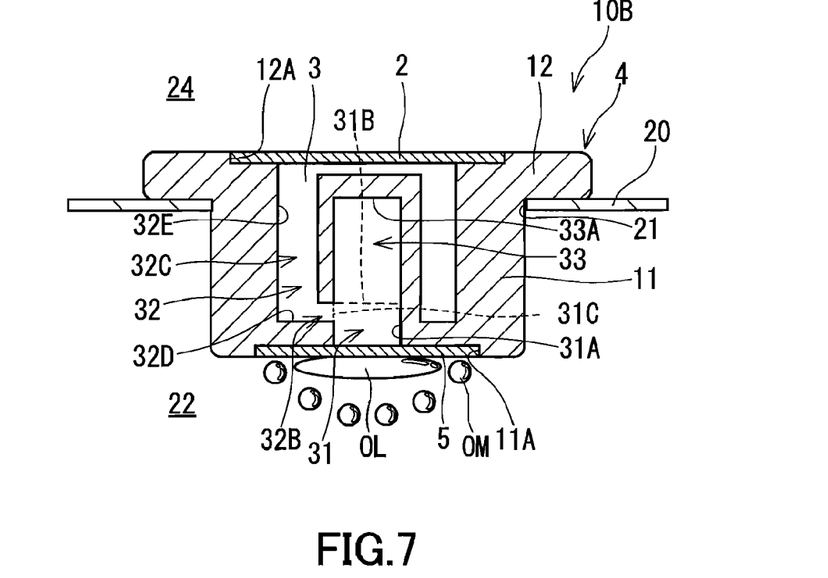
FIG. 7 is a cross-sectional view of the ventilation member shown in FIG. 5 in a normal state.
Figure 8:
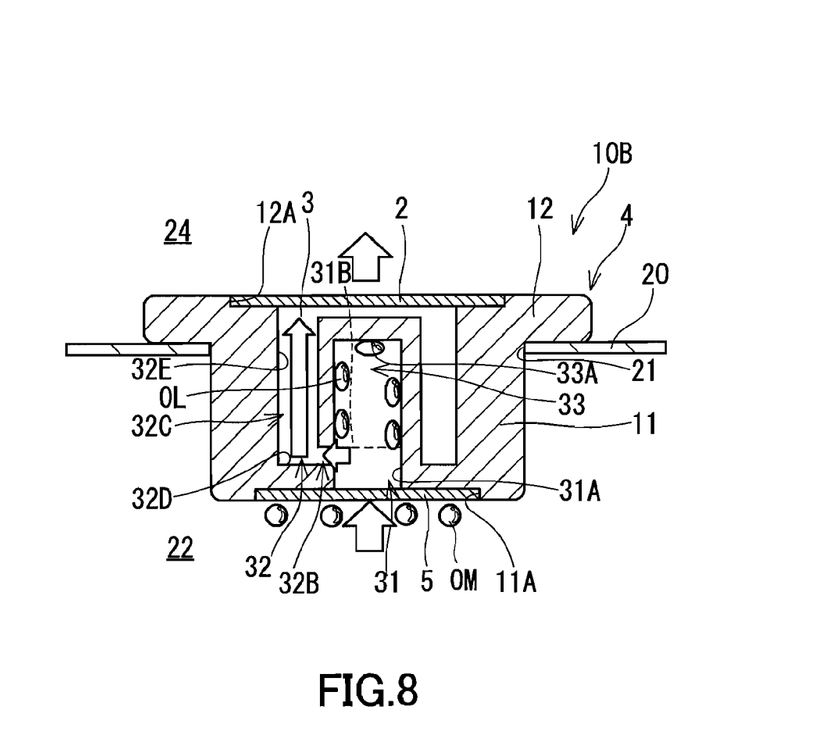
FIG. 8 is a cross-sectional view of the ventilation member shown in FIG. 5 in a positive pressure state.

In the present embodiment, when the pressure inside the housing 20 is equal to the pressure outside the housing 20, oil droplets OL adhere to the surface of the filter member 5 exposed to the interior space 22 but do not pass through the filter member 5, as shown in FIG. 7. That is, the oil droplets OL do not move from the interior space 22 of the housing 20 to the first air passage 31. However, when the pressure inside the housing 20 is a positive pressure, oil mist OM in the interior space 22 of the housing 20 passes through the filter member 5, as shown in FIG. 8. That is, the oil mist OM moves from the interior space 22 of the housing 20 to the first air passage 31. When the oil mist OM enters the first air passage 31 and the dead end passage 33 through the filter member 5, the oil mist OM coalesces into larger oil droplets OL therein. Then, the oil droplets OL adhere to the inner wall 31A of the first air passage 31 and the inner wall 33A of the dead end passage 33. As shown in FIG. 8, since the oil mist OM that has passed through the filter member 5 goes straight ahead even if the airflow direction is changed, the oil mist OM does not enter the second air passage 32 and thus the oil droplets OL do not adhere to the inner wall of the second air passage 32, specifically, the first inner wall 32D of the first sub-passage 32B and the second inner wall 32E of the second sub-passage 32C. Since the oil mist OM does not enter the second air passage 32, adhesion of the oil mist OM to the air-permeable membrane 2 can be prevented.

In the present embodiment, even if the oil mist OM enters the first sub-passage 32B, the oil droplets OL are less likely to move toward the air-permeable membrane 2 because the direction in which the first sub-passage 32B extends intersects the direction in which the second sub-passage 32C extends. Therefore, adhesion of the oil droplets OL to the air-permeable membrane 2 can be prevented without fail.

Hereinafter, the present invention will be described in more detail by way of examples, but the present invention is not limited to the following examples.

Example 1

A ventilation member shown in FIG. 1 and FIG. 2 was attached to the opening of a housing, and ATF (Automatic Transmission Fluid) Auto Fluid D-II (manufactured by Toyota Motor Corporation) was sprayed at an air pressure of 40 kPa onto the ventilation member from the interior space side of the housing. Then, the ventilation member was detached from the housing, and a visual check was made to see whether the ATF adhered to an air-permeable membrane. No ATF adhered to the air-permeable membrane.

Example 2

The experiment was conducted in the same manner as in Example 1 except that the air pressure was 60 kPa. No ATF adhered to the air-permeable membrane.

Example 3

The experiment was conducted in the same manner as in Example 1 except that the air pressure was 80 kPa. No ATF adhered to the air-permeable membrane.

The air permeability of each air-permeable membrane was measured before and after the ATF adhesion test by the Gurley test method specified in JIS (Japanese Industrial Standards) P 8117. Table 1 shows the results of Examples 1 to 3. The air permeability after the ATF adhesion test is expressed as a ratio to the air permeability before the ATF adhesion test when the air permeability before the test is 100.

TABLE 1

| | Air permeability before test | Air permeability after test | Air pressure (kPa) | Adhesion of ATF |
|---|---|---|---|---|
| Example 1 | 100 | 100 | 40 | No adhesion observed |
| Example 2 | 100 | 109 | 60 | No adhesion observed |
| Example 3 | 100 | 102 | 80 | No adhesion observed |

Comparative Example 1

A sealing cap (manufactured by Nitto Denko Corporation) serving as a conventional ventilation member was attached to the opening of a housing, and ATF was sprayed at an air pressure of 25 kPa onto the ventilation member from the interior space side of the housing. Then, the ventilation member was detached from the housing, and a visual check was made to see whether the ATF adhered to an air-permeable membrane. The ATF adhered to the air-permeable membrane.

Figure 10:
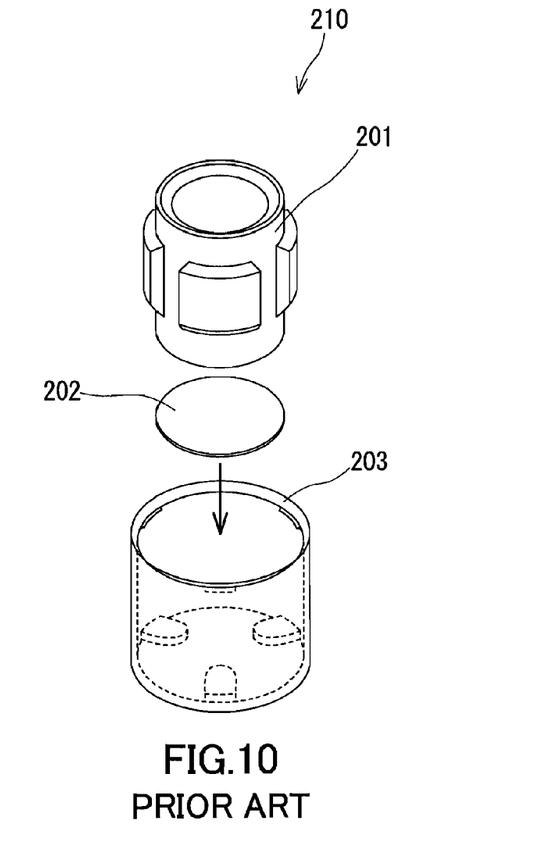
FIG. 10 is a perspective view of a conventional ventilation member.

As shown in FIG. 10, the sealing cap 210 is composed of a bottomed cylindrical cover part 203, a rubber cylindrical tube 201, and an air-permeable membrane 202. The cylindrical tube 201 has a slightly smaller diameter than the cover part 203, and the air-permeable membrane 202 is disposed on one opening of the cylindrical tube 201 so as to close the opening. When the cylindrical tube 201 is fitted into the cover part 203 such that the air-permeable membrane 202 is placed in the cover part 203, air passages are formed between the inner peripheral surface of the cover part 203 and the outer peripheral surface of the cylindrical tube 201 and between the bottom surface of the cover part 203 and the air-permeable membrane 202. The sealing cap 210 is attached to a housing by inserting the cylindrical tube 201 into the opening formed in the housing.

Comparative Example 2

The experiment was conducted in the same manner as in Comparative Example 1 except that the air pressure was 30 kPa. The ATF adhered to an air-permeable membrane.

The air-permeability (Gurley Number) of each air-permeable membrane was measured before and after the ATF adhesion test by the Gurley test method specified in JIS (Japanese Industrial Standards) P 8117. Table 2 shows the results of Comparative Examples 1 and 2. The air permeability after the ATF adhesion test is expressed as a ratio to the air permeability before the ATF adhesion test when the air permeability before the test is 100.

TABLE 2

| | Air permeability before test | Air permeability after test | Air pressure (kPa) | Adhesion of ATF |
|---|---|---|---|---|
| Comparative | 100 | 147 | 25 | Adhesion |

TABLE 2-continued

| | Air permeability before test | Air permeability after test | Air pressure (kPa) | Adhesion of ATF |
|---|---|---|---|---|
| Example 1 | | | | observed |
| Comparative Example 2 | 100 | 209 | 30 | Adhesion observed |

As shown in Table 1, in the ventilation members of Examples 1 to 3, no adhesion of ATF to the air-permeable membranes was observed visually. There was little difference in the air permeability of the air-permeable membrane before and after the ATF adhesion test. As shown in Table 2, in the ventilation members of Comparative Examples 1 and 2, adhesion of ATF to the air-permeable membranes was observed, and there was a significant difference in the air permeability of the air-permeable membrane before and after the ATF adhesion test. In Comparative Examples using a sealing cap, the air permeability of the air-permeable membrane decreased, as described above. However, even if the same test was conducted using the conventional ventilation member shown in FIG. 9, the air permeability of the air-permeable membrane also decreases.

The ventilation member of the present invention can be used for housings for automotive components such as lamps, motors, sensors, switches, ECUs, and gear boxes. The ventilation member of the present invention can be used not only for automotive components but also for electric appliances such as mobile communication devices, cameras, electric shavers, and electric toothbrushes.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A ventilation member attachable to an opening of a housing, the ventilation member comprising:
a support having a through hole serving as an air passage between an interior space and an exterior space of the housing when the support is attached to the opening;
a filter member disposed on the support to cover an aperture of the through hole that opens into the interior space; and
an air-permeable membrane disposed on the support to cover an aperture of the through hole that opens into the exterior space,
wherein
the through hole comprises:
a first air passage extending in a predetermined direction from one end of the first air passage to the other end of the first air passage, the one end forming the aperture that opens into the interior space;
a second air passage having one end connected to a side of the first air passage and the other end forming the aperture that opens into the exterior space; and
a dead end passage extending in the predetermined direction from the other end of the first air passage.

2. The ventilation member according to claim 1, further comprising a cover member provided over the air-permeable membrane to cover the support.

3. The ventilation member according to claim 1, wherein the predetermined direction intersects a direction in which the support is attached to the opening.

4. The ventilation member according to claim 1, wherein the predetermined direction is opposite to a direction in which the support is attached to the opening.

5. The ventilation member according to claim 4, wherein the second air passage comprises:
a first sub-passage having one end connected to a side of the first air passage; and
a second sub-passage having one end connected to the first sub-passage and the other end connected to the aperture that opens into the exterior space,
the first sub-passage extends in a direction intersecting the direction in which the support is attached to the opening, and
the second sub-passage extends in a direction opposite to the direction in which the support is attached to the opening.

* * * * *